（12）United States Patent
Chuang et al.

(10) Patent No.: US 11,511,920 B2
(45) Date of Patent: Nov. 29, 2022

(54) SEALED RETICLE STORAGE DEVICE WITH SOFT CONTACT

(71) Applicant: GUDENG PRECISION INDUSTRIAL CO., LTD., New Taipei (TW)

(72) Inventors: Chia-Ho Chuang, New Taipei (TW); Hsin-Min Hsueh, New Taipei (TW); Yi-Hsuan Lee, New Taipei (TW); Hsing-Min Wen, New Taipei (TW); Ming-Chien Chiu, New Taipei (TW)

(73) Assignee: GUDENG PRECISION INDUSTRIAL CO., LTD., New Taipei (TW)

( * ) Notice: Subject to any disclaimer, the term of this patent is extended or adjusted under 35 U.S.C. 154(b) by 162 days.

(21) Appl. No.: 16/929,748

(22) Filed: Jul. 15, 2020

(65) Prior Publication Data
US 2021/0047094 A1   Feb. 18, 2021

Related U.S. Application Data

(60) Provisional application No. 62/887,753, filed on Aug. 16, 2019.

(51) Int. Cl.
| *B65D 53/06* | (2006.01) |
| *B65D 85/38* | (2006.01) |
| *G03F 1/66* | (2012.01) |
| *H01L 21/673* | (2006.01) |
| *B01D 46/00* | (2022.01) |
| *B01D 46/42* | (2006.01) |
| *B01D 46/54* | (2006.01) |
| *F16K 27/02* | (2006.01) |

(Continued)

(52) U.S. Cl.
CPC ........... *B65D 53/06* (2013.01); *B01D 46/001* (2013.01); *B01D 46/4272* (2013.01); *B01D 46/543* (2013.01); *B65D 81/24* (2013.01); *B65D 85/30* (2013.01); *B65D 85/38* (2013.01); *F16K 27/02* (2013.01); *G03F 1/66* (2013.01); *G03F 7/70916* (2013.01); *H01L 21/67359* (2013.01); *H01L 21/67389* (2013.01); *B01D 2271/027* (2013.01); *B01D 2279/51* (2013.01)

(58) Field of Classification Search
CPC ........ B65D 53/06; B65D 85/38; B65D 85/30; G03F 1/66; H01L 21/67359; B01D 21/67389; B01D 21/67359; B01D 46/543
USPC ...................................... 206/316.1, 701–728
See application file for complete search history.

(56) References Cited

U.S. PATENT DOCUMENTS 3,334,774 A * 8/1967 Poltorak ................ F16J 15/106
277/648
3,615,006 A * 10/1971 Freed ................ H01L 21/67353
206/811

(Continued)

*Primary Examiner* — Rafael A Ortiz
(74) *Attorney, Agent, or Firm* — Locke Lord LLP; Tim Tingkang Xia, Esq.

(57) ABSTRACT

The invention discloses a reticle storage device including a top lid, a bottom lid and a soft contact member. The top lid has a ceiling and a cover surrounding the ceiling. The bottom lid has a carrier and a peripheral structure surrounding the carrier. The soft contact member is configured to laterally extend in between the cover and the peripheral structure when the top lid and the bottom lid engage with each other, and to extend from an inside to an outside of the device in order to buffer the contact among the two lids.

16 Claims, 9 Drawing Sheets

(51) Int. Cl.
　　　*B65D 81/24*　　　(2006.01)
　　　*B65D 85/30*　　　(2006.01)
　　　*G03F 7/20*　　　(2006.01)

(56) References Cited

U.S. PATENT DOCUMENTS

| | | | | |
|---|---|---|---|---|
| 4,854,476 | A | * | 8/1989 | Serio, Jr. ................. B65D 53/02 |
| | | | | 220/4.01 |
| 5,611,452 | A | * | 3/1997 | Bonora ..................... G03F 1/66 |
| | | | | 414/217 |
| 7,828,302 | B2 | * | 11/2010 | Hurlbert ................ F16J 15/125 |
| | | | | 277/637 |
| 2007/0175792 | A1 | * | 8/2007 | Gregerson ........ H01L 21/67376 |
| | | | | 206/711 |
| 2012/0037522 | A1 | * | 2/2012 | Chiu ................ H01L 21/67359 |
| | | | | 206/316.1 |
| 2014/0238980 | A1 | * | 8/2014 | Yamaguchi .......... A45C 13/008 |
| | | | | 29/428 |

* cited by examiner

SEALED RETICLE STORAGE DEVICE WITH SOFT CONTACT

RELATED APPLICATIONS

This application claims priority to and the benefit of U.S. Provisional Application No. 62/887,753 filed Aug. 16, 2019. The entire disclosure of which is incorporated by reference herein.

BACKGROUND

Technical Field

The present invention relates to a reticle storage device, particularly to a sealing (i.e. hermetical) reticle pod with soft contacts.

Description of Related Art

A known reticle pod generally includes an outer pod and an inner pod, wherein the outer pod is the outermost of the reticle pod and the inner pod is accommodated in the outer pod. Some types of the outer pod may be composed of a top lid and a bottom lid. Similarly, the inner pod may be composed of a top lid and a bottom lid while receives a reticle therein.

Contamination control for extreme ultraviolet (EUV) reticle mainly depends on the combination of the top and bottom lids of the inner pod to prevent particles and dusts from entering the inner pod. Conventional design for the inner pod having the top and bottom lids uses means for hermetic to block flow communication between the internal pod environment and the external environment in order to stop air flow between the inside and outside of the pod, and therefore prevent a reticle within the inner pod from being contaminated. However, such hermetic design for the inner pod may have some drawbacks. For example, the top lid and bottom lids of the inner pod is usually metallic structured, and therefore it is possible to generate particles due to hard collision between the top lid and the bottom lid, causing the wafer received in the inner pod contaminated. Moreover, an effective sealing of the inner pod can be determined based on the roughness of the metallic contact interfaces of the top lid and the bottom lid, and the requirement of said roughness must be very high so as to fulfill the effective sealing. The cost relatively increases.

Therefore, there remains a need for developing a solution to overcome the foregoing drawbacks existing in the conventional hermetic design of inner pod to keep a reticle received in an inner pod from contaminated.

SUMMARY OF INVENTION

An objective of the invention is to provide a reticle storage device, including: a top lid having a ceiling and a cover surrounding the ceiling; a bottom lid having a carrier and a peripheral structure surrounding the carrier, wherein the peripheral structure faces the cover when the top lid and the bottom lid engages with each other; and a soft contact member, configured to extend between the cover and the peripheral structure where the top lid and the bottom lid engage with each other in order to buffer the contact of the top lid and the bottom lid. The soft contact member extends from an inside to an outside of the device.

In one preferred embodiment, the cover of the top lid has a downward engaging surface, the soft contact member extends along and wraps the downward engaging surface.

In one preferred embodiment, the soft contact member has a downward sealing surface configured for contacting with an upward engaging surface of the peripheral structure of the bottom lid.

In one preferred embodiment, the soft contact member has a downward sealing surface and at least one rib down extending from the downward sealing surface, the at least rib is configured for contacting with an upward engaging surface of the peripheral structure of the bottom lid.

In one preferred embodiment, the cover of the top lid has a downward engaging surface and a plurality of pillars down extending from the downward engaging surface, the peripheral structure has a plurality of accommodation cavities corresponding to the plurality of pillars, each of the plurality of pillars has at least one elastic structure configured for buffering the contact of the top lid and the bottom lid.

Another objective of the invention is to provide a reticle storage device including: a top lid having a ceiling and a cover surrounding the ceiling; a bottom lid having a carrier and a peripheral structure surrounding the carrier, wherein the peripheral structure faces the cover when the top lid and the bottom lid engages with each other; a first soft contact member, extending laterally along a downward engaging surface of the cover of the top lid; and a second soft contact member, extending laterally along an upward engaging surface of the peripheral structure of the bottom lid. the first soft contact member and the second soft contact member contact with each other when the top lid engages with the bottom lid so as to buffer the contact among the top lid and the bottom lid.

In one preferred embodiment, an inside of the first soft contact member contacts with an outside of the second soft contact member.

In one preferred embodiment, at least a part of the first soft contact member wraps the cover of the top lid.

In one preferred embodiment, the hardness of the first contact member is larger than that of the second soft contact member.

Advantages and features of the present invention will be discussed in details through the following description and drawings illustrated by the principle of invention.

BRIEF DESCRIPTION OF THE DRAWINGS

The above-mentioned and other features and advantages of the disclosure can be better understood with reference to the following detailed description and drawings.

DETAILED DESCRIPTION

Various exemplary embodiments will be described in detail with reference to the accompanying drawings that form a part of the present disclosure. Also, these embodiments are described with examples that could be carried out to achieve said embodiments, wherein sufficient details are provided to allow a person ordinarily skilled in the art to achieve said embodiments. It will be appreciated that, without departing from the spirit and scope of said embodiments, other embodiments could be used and other changes could be made. In addition, despite the foregoing, appearances of the phrase "in one embodiment" are not necessarily referring to the same or one single embodiment. Therefore, the following detailed description is not to be taken in a limiting sense, and the scope of said embodiments is defined by the appended claims alone.

Unless otherwise specified in the entire description and the appended claims, each of the following terms carries the meaning specifically defined below. As used herein, unless otherwise specified, the term "or" is to be taken in an inclusive sense, and is equivalent to the term "and/or." Unless otherwise specified herein, the term "according to" is not to be taken in an exclusive sense, and allows references to be made to many other factors not described herein. Additionally, in the entire description, the terms "a," "one" and "the" are also used in the plural sense. The term "in" is used herein to mean both "in" and "on."

Figure 1A:
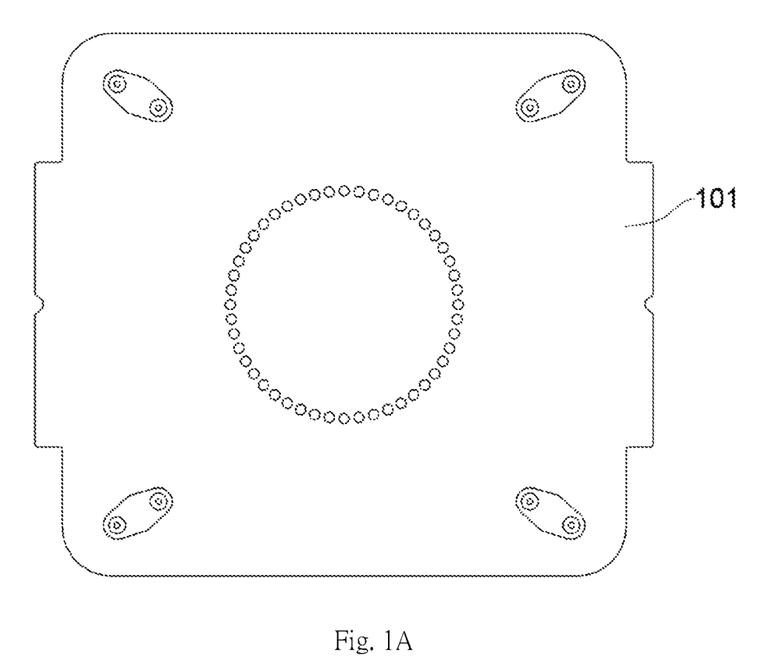
FIGS. 1A and 1B show a top view and a side view of a reticle storage device respectively.
Figure 1B:
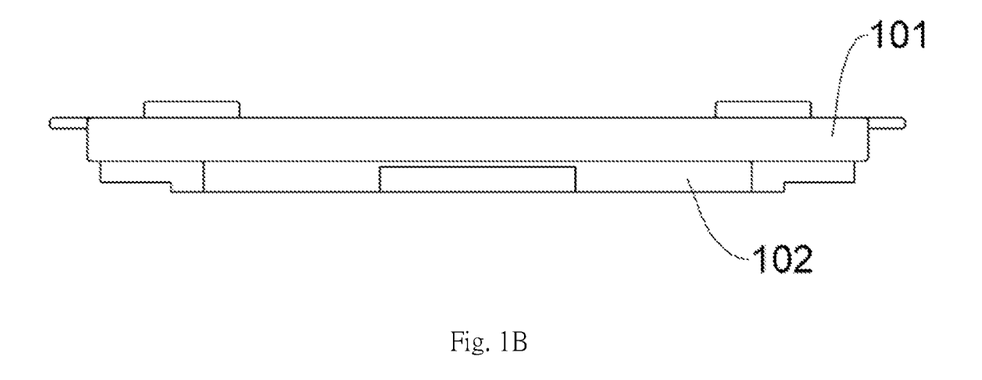

The invention aims to provide a reticle storage device that is able to form hermetical sealing. FIGS. 1A and 1B respectively show a top view and a side view of a reticle storage device. The reticle storage device includes a top lid (101) and a bottom lid (102). A reticle (not shown) can be accommodated between the top lid (101) and the bottom lid (102). A particular feature of said reticle storage device is that the accommodated reticle is sealed when the top lid (101) engages with the bottom lid (102) by one or more soft (resilient) contact members. Despite not shown, said reticle storage device can further be received in an outer pod. The reticle storage device according to the invention mainly relates to an inner pod. The top lid (101) and the bottom lid (102) may be provided with structures or contacts on their peripheral surface in order to connect with the outer pod.

Figure 2:
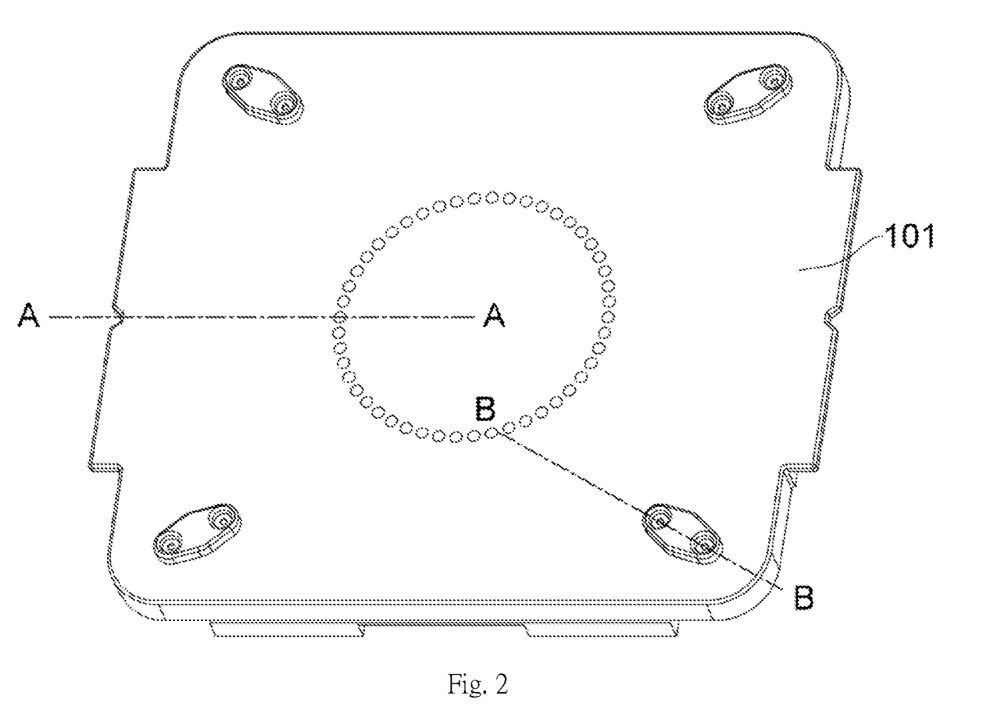
FIG. 2 shows a perspective view of the reticle storage device.

FIG. 1A is a top view that shows that the reticle storage device according to the invention has a center region and four edges surrounding the center region. Said reticle accommodating space is generally beneath the center area. The reticle storage device is provided with soft contact members (not shown) between the center region and the edges such that a sealed accommodation space is formed when the top lid (101) engages with the bottom lid (102), giving the reticle storage device hermetically sealed. Air flow can be stopped by one or more soft contact members (not shown) between the top lid (101) and the bottom lid (102) in FIG. 1B. As shown in FIG. 1A and FIG. 2, the top lid (101) may be further provided with plural inlet holes (not numbered) on its top, which is used for air backfilling, and a filer (not shown) used for filtering particles.

Figure 8:
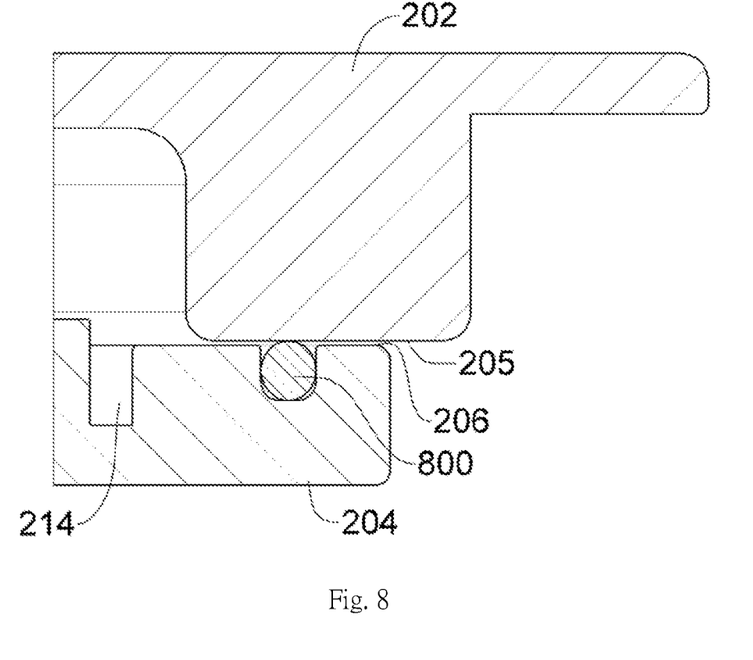
FIG. 8 is a cross-sectional view of a further embodiment of the reticle storage device according to the invention.

FIG. 2 shows a perspective view of the reticle storage device according to the invention with an AA line and a BB line. FIGS. 3, 4A to 4B and 6A to 6B are cross-sectional views according to the AA line, showing distinct embodiments of the soft contact members. Moreover, FIG. 8 is a cross-sectional view of the BB line.

Figure 3:
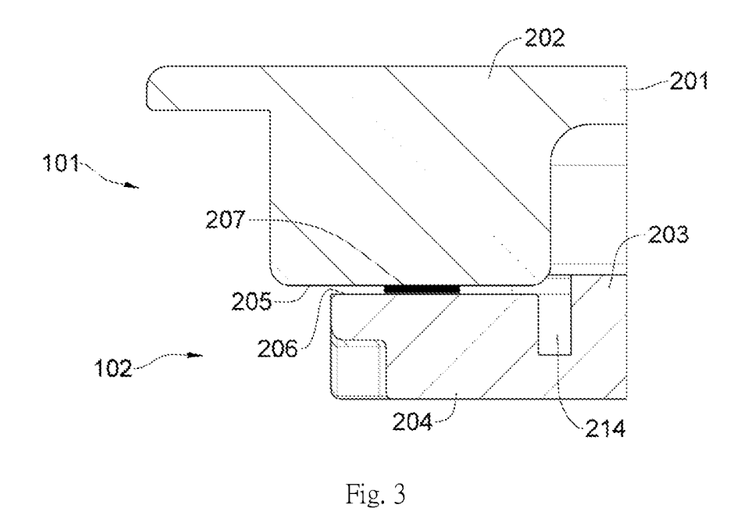
FIG. 3 is a cross-sectional view of the reticle storage device according to the AA line.

FIGS. 3A to 3C, a top lid (101) has a ceiling (201) and a cover (202) extending horizontally and downwardly from the ceiling (201). The cover (202) has a relatively large thickness. Despite only a portion of view is shown, it is expected the cover (202) surrounds the ceiling (201) and extends toward to the four edges of the top lid (101). The bottom lid (102) has a carrier (203) and a peripheral structure (204). Said carrier (203) provides a carrying surface for carrying a reticle. The carrier (203) may provide plural supporting or restricting pieces to define a reticle accommodation region. The peripheral structure (204) extending along the four edges of the bottom lid (102) surrounds the carrier (203) and is slightly lower than the carrying surface of the carrier (203). In some embodiments, the peripheral structure (204) may be higher than the carrying surface of the carrier (203).

When the top lid (101) and the bottom lid (102) engage with each other, the carrier (203) and the ceiling (201) as well as the cover (202) define the reticle accommodation space. The cover (202) of the top lid (101) faces the peripheral structure (204) of the bottom lid (102) without fully contacting with each other. Alternatively, the cover (202) and the peripheral structure (204) may partially contact with each other. The cover (202) of the top lid (101) has a downward engaging surface (205) while the peripheral structure (204) of the bottom lid (102) has an upward engaging surface (206). In the case where the top lid (101) engages with the bottom lid (102), the downward engaging surface (205) faces the upward engaging surface (206) and both surfaces are parallel. In the embodiment, the downward engaging surface (205) has an area larger than that of the upward engaging surface (206). A soft contact member (207) is configured to extend between the cover (202) and the peripheral structure (204) when the top lid (101) engages with the bottom lid (102). Also, the soft contact member (207) extends from an inside to an outside of the device. Said inside is the side of the reticle accommodation space while said outside is the side out of said device. Various embodiments of the soft contact members (207) mounted on the downward engaging surface (205) will be described below. However, in some other embodiments, the soft contact member (207) may be mounted on the peripheral structure (204) of the bottom lid (102). With the soft contact member, collision between top lid (101) and the bottom lid (102) can be mitigated.

Said soft contact member according to the invention indicates the member having a hardness less than the top lid and/or the bottom lid. In general, said top lid and the bottom lid are made of metal and said soft contact member may be selected from materials having a harness relatively less than that of metal, such as plastic or resin.

Figure 4A:
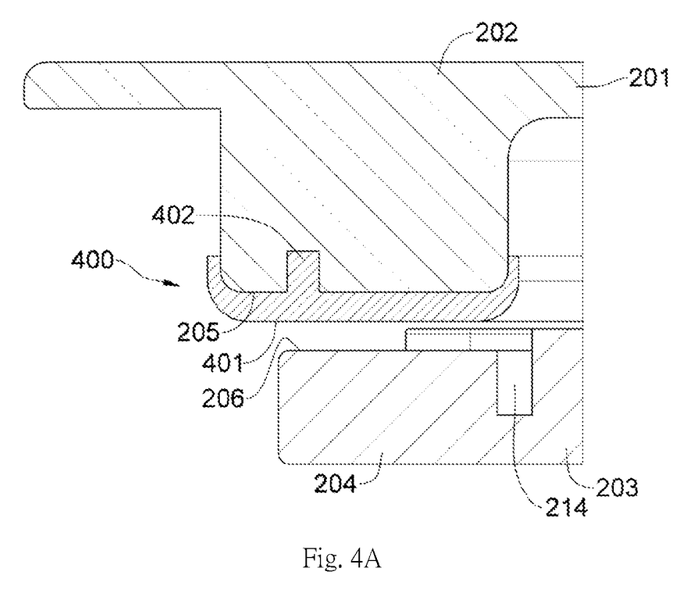
FIGS. 4A to 4B illustrate distinct embodiments of the reticle storage device according to the invention.

FIG. 4A illustrates one embodiment of the soft contact member according to the invention where the top lid and the bottom lid are not completely engaged. A soft contact member (400) wraps the downward engaging surface (205) of the cover (202), and the soft contact member (400) has particular folding structures formed around said inside and outside of the device, which ensures the peripheral and corners of the downward engaging surface (205) to be completely wrapped. The soft contact member (400) has a downward sealing surface (401) which is generally parallel to the upward engaging surface (206) of the peripheral structure (204), such that the downward sealing surface (401) of soft contact member (400) can effectively contact the upward engaging surface (206) to avoid air gaps. As shown in the figure, the soft contact member (400) has an engaging member (402) formed on the side opposite to the downward sealing surface (401), the engaging member (402) can be inserted or embedded into the cover (202) such that the soft contact member (400) can be securely attached to the downward engaging surface (205). In other embodiments, the engaging member (402) may be neglected, and the soft contact member (400) may be adhered to the downward engaging surface (205).

Figure 4B:
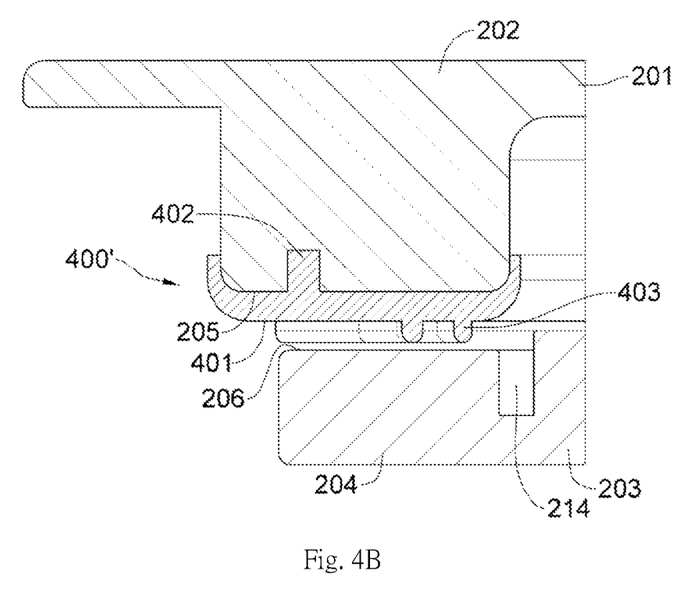

FIG. 4B illustrates another embodiment of the soft contact member according to the invention where the top lid and the bottom lid are not completely engaged with each other. Distinctly from the foregoing embodiment, a soft contact member (400') has a downward sealing surface (401) with at least one rib (403) formed thereon and extending downward. This embodiment has two ribs (403) formed around said inside and outside respectively. In other embodiments, the soft contact member may include less or more of the ribs (403). Despite not shown in the figure, it can be expected that the ribs (403) can extend along the cover (202). In the case where the top lid (101) and the bottom lid (102) engage with each other, the ribs (403) contact with the upward engaging surface (206) of the peripheral structure (204), and such that the reticle accommodation space is hermetically sealed.

Figure 5:
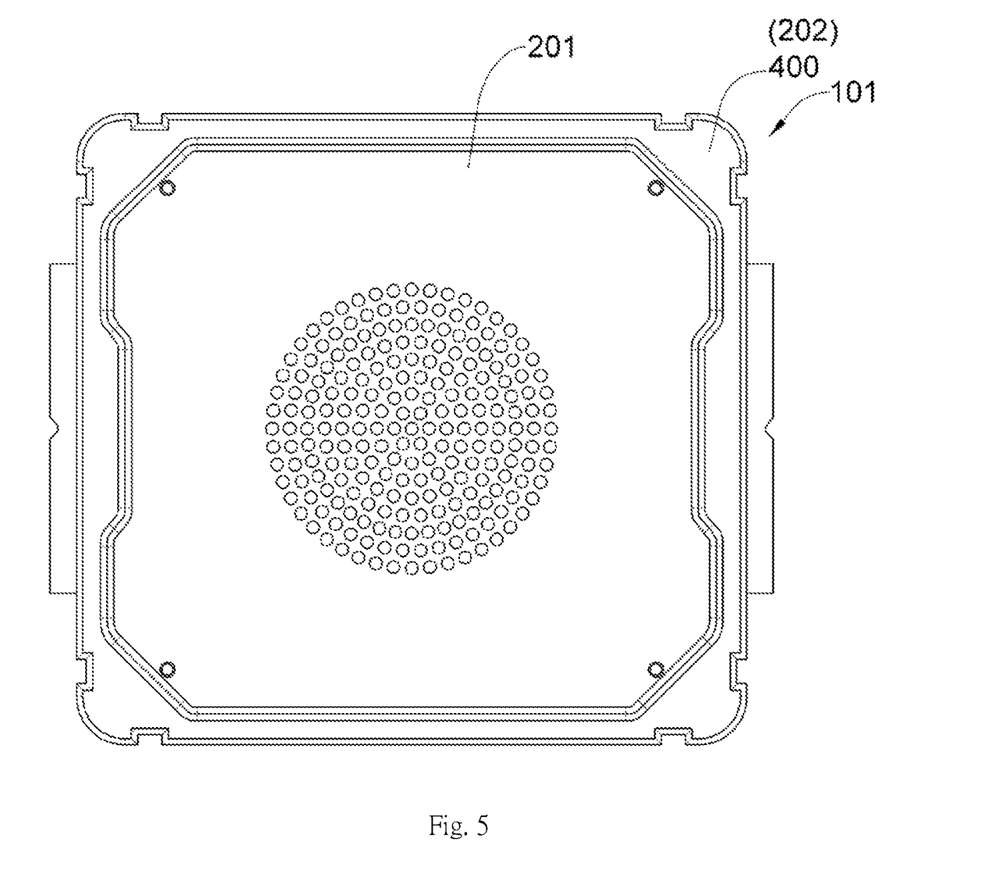
FIG. 5 illustrates a bottom view of the top lid according to FIG. 4A.

FIG. 5 illustrates a bottom view of the top lid (101) according to FIG. 4A, the ceiling (201) is surrounded by the cover (202), the soft contact member (400) extends along the cover (202) and warps the downward engaging surface thereof. In this embodiment, the soft contact member (400) extends evenly along the cover (202) of the top lid. In other possible embodiments, the soft contact member (400) may have ups and downs across its extension.

Figure 6A:
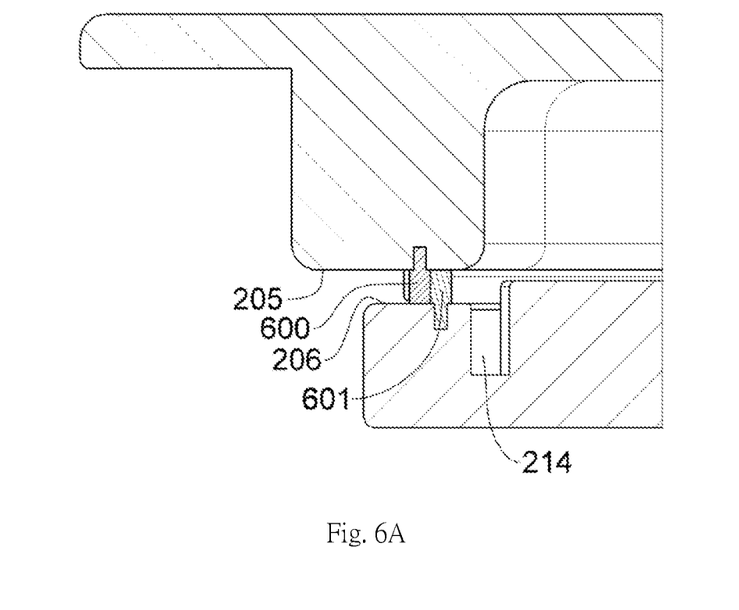
FIGS. 6A to 6B illustrate other distinct embodiments of the reticle storage device according to the invention.

FIG. 6A illustrates a further embodiment of the invention where the top lid and the bottom lid are engaged. A first soft contact member (600) mounts to the downward engaging surface (205) of the cover (202) and down extends a height from the downward engaging surface (205). A second soft contact member (601) mounts to the upward engaging surface (206) of the peripheral structure (204) and up extends a height from the upward engaging surface (206). The heights of first and second soft contact members (600 and 601) may be identical or different. Preferably, the heights of the first and the second soft contact members (600 and 601) are identical so that the first and the second soft contact members (600 and 601) are able to contact with the upward and downward engaging surfaces (205 and 206) respectively to form a better hermetical sealing. Preferably, in the case where the top lid (101) and the bottom lid (102) are engaged with each other, an inside of the first soft contact member (600) is able to fully contact with an outside of the second soft contact engaging surface (601) so as not to form air gaps. The first and second soft contact members (600 and 601) are partially inserted or embedded into the downward and upward engaging surfaces (205 and 206) respectively to avoid movement.

Figure 6B:
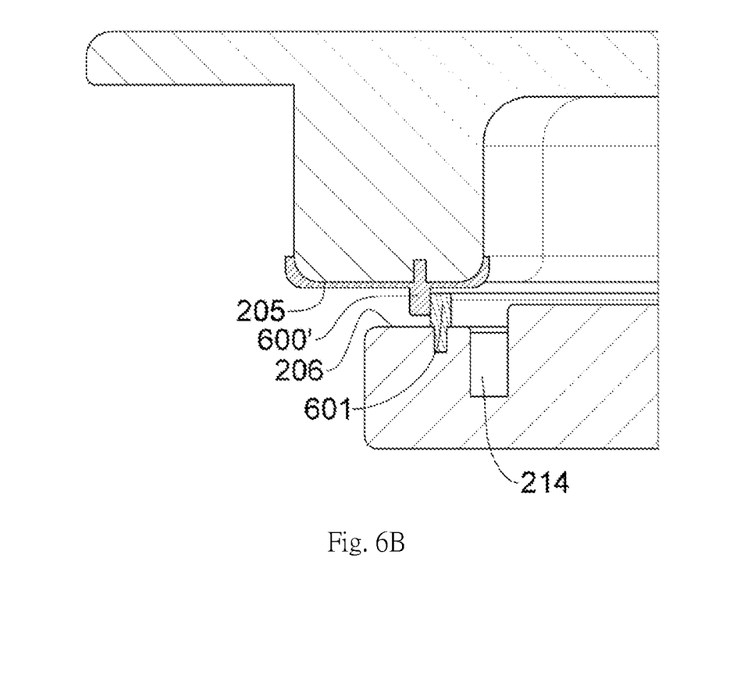

FIG. 6B illustrates one more embodiment of the invention where the top lid and the bottom lid are not engaged with each other. Distinctly from the foregoing embodiment, a first soft contact member (600') further has a lateral extension wrapping the downward engaging surface (205). Therefore, in the case where the top lid (101) and the bottom lid (102) engage with each other, the second soft contact member (601) not only contacts with an inside of the first soft contact member (600') but also a downward sealing surface of the soft contact member (600') so as to increase the hermetical sealing. It is worth to note, in the case where such top lid and bottom lid are provided with the soft contact members, an excessive deformation in any contact member is undesired under their contact, and this is to prevent air gaps formed therebetween.

Figure 7A:
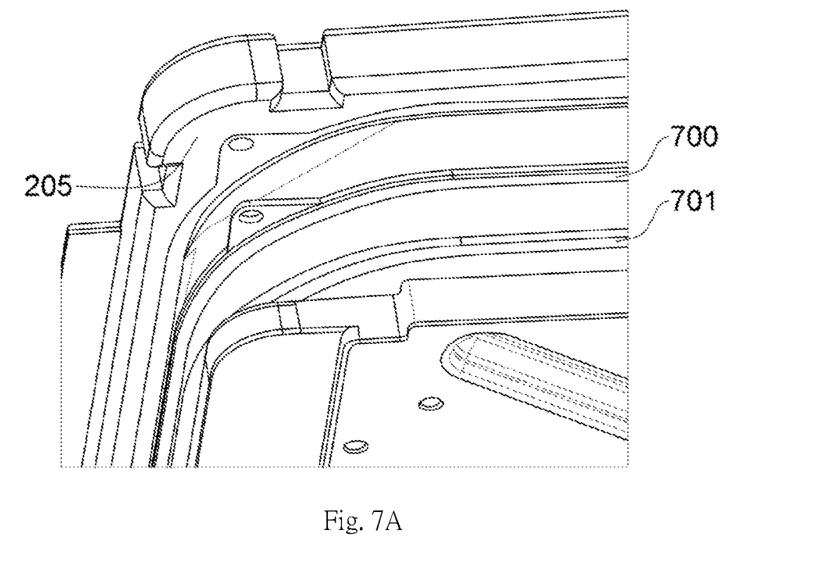
FIGS. 7A to 7B are an exploded view and a cross-sectional view of another embodiment of the reticle storage device of the invention.
Figure 7B:
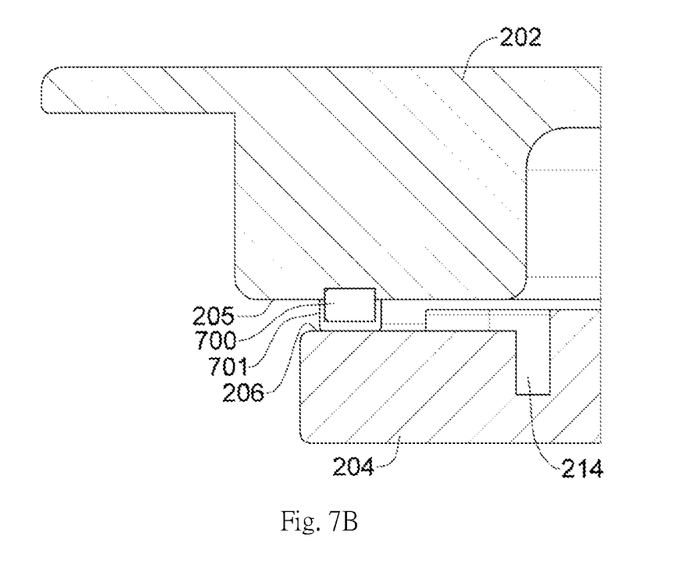

FIG. 7A illustrates an exploded view of another embodiment, and FIG. 7B is a cross-sectional view thereof. A first soft contact member (700) is mounted to the downward engaging surface (205) of the cover (202). A second soft contact member (701) is mounted to the first soft contact member (700) by means for embedding or securing. The first soft contact member (700) is a material harder than that of the second soft contact member (701), such as a plastic like PEEK. In other words, the first soft contact member (700) according to the embodiment is similar to a frame.

FIG. 8 is a cross-sectional view of one further embodiment. A soft contact member (800) is partially embedded into a trench extending along the peripheral structure (204), and thus the soft contact member (800) can be exposed and partially protruding from the upward engaging surface (206) of the peripheral structure (204). The cover (202) contacts the soft contact member (800) with the downward engaging surface (205) to form a hermetical sealing. A cross-sectional shape of the soft contact member (800) can be any substitute shape.

In addition, as illustrated in FIGS. 3, 4A to 4B, 6A to 6B, 7B and 8, at least one trench (214) may be formed between said peripheral structure (204) and said carrier (203). Despite the foregoing embodiments have hermetical sealing formed by the soft contact members, said trench (214) can further assist particle capturing, increasing the difficulty that particles jump to the carrier.

Figure 9:
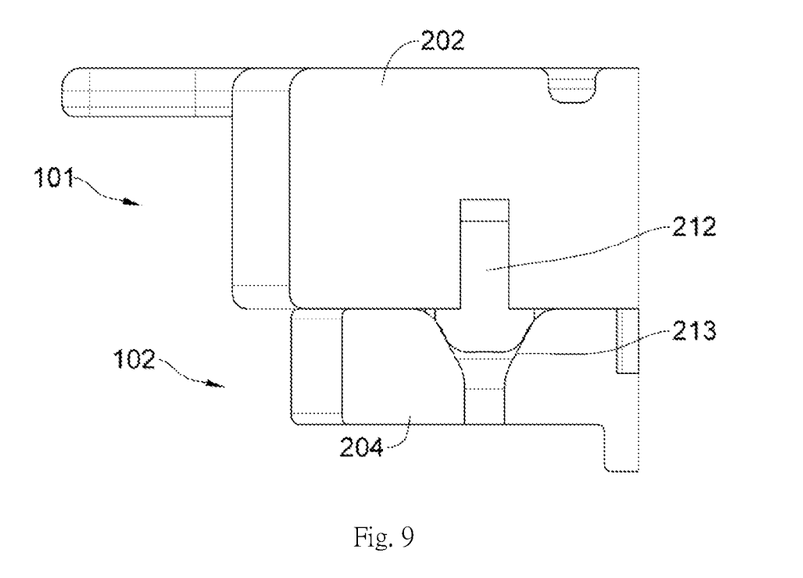
FIG. 9 is a cross-sectional view of the reticle storage device according to the BB line.

FIG. 9 is a cross-sectional view of the BB line, illustrating a corner structure of the reticle storage device according to the invention, which includes means for buffering the top lid (101) and the bottom lid (102). The cover (202) of the top lid (101) includes multiple pillars (212), these pillars (212) may be provided at four corners of the top lid (101), or at other position with a relative large area on the cover, and down extending from the cover (202). Multiple corresponding accommodation cavities (213) are formed on the peripheral structure (204) of the bottom lid (102) and configured to receive corresponding pillars (212) such that the cover (202) of the top lid (101) can be lifted above the peripheral structure (204) of the bottom lid (102), achieving an effective buffering. In one embodiment, a height of the exposed part of the pillar (212) is larger than an effective accommodation depth of the accommodation cavity (213) such that the top lid (101) can be slightly lifted above the bottom lid (102) despite this is not clearly depicted in the figure. The foregoing soft contact members (400, 400' and 600') can go around these pillars (212) or may be integrally formed with these pillars (212).

Figure 10:
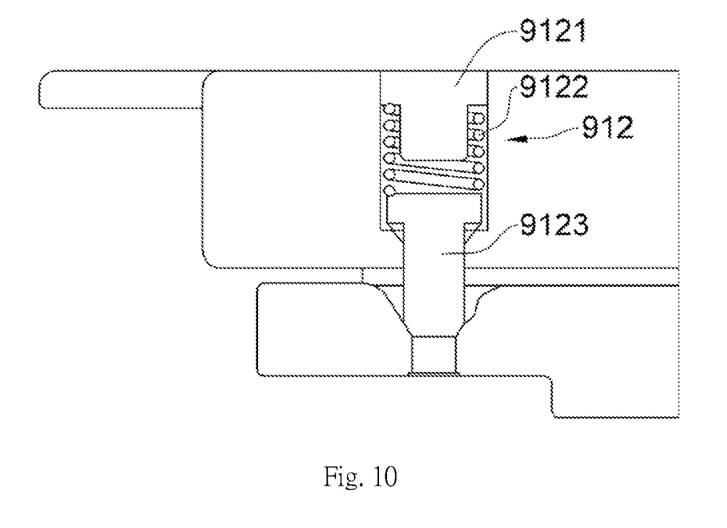
FIG. 10 is a cross-sectional view of another embodiment of the reticle storage device according to the BB line.
Figure 11:
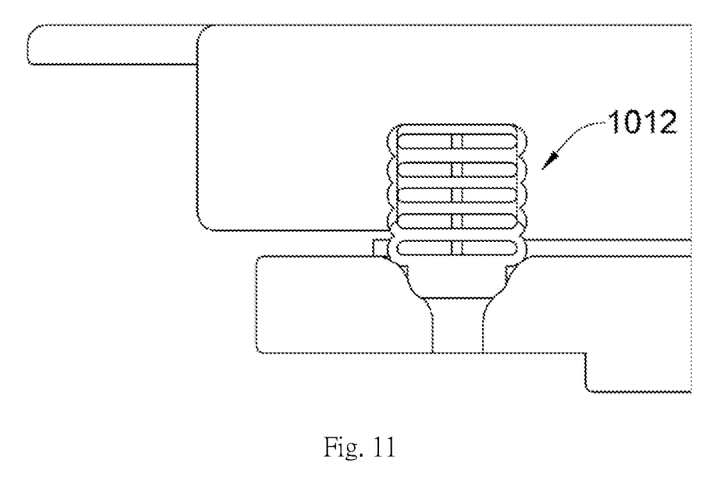
FIG. 11 is a cross-sectional view of yet another embodiment of the reticle storage device according to the BB line.
Figure 12:
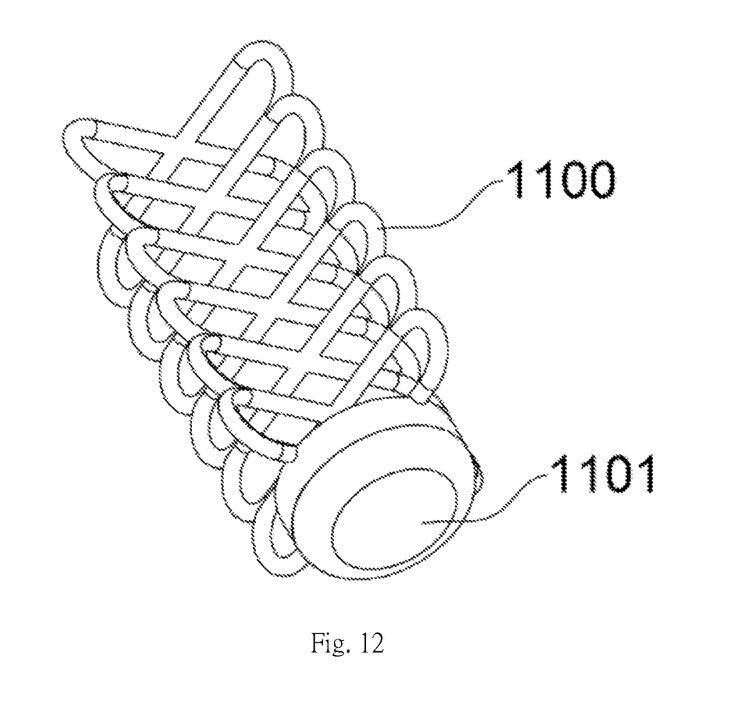
FIG. 12 illustrates a specific structure of the pillar shown in FIG. 10.

FIG. 10 is a cross-sectional view according to the BB line but of another embodiment. Distinctly, the pillar (912) has two elastic structures which respectively are a spring (9122) engaging with a mounting member (9121) and an elastic terminal (9123) connecting to a bottom of the spring (9122). The material of the elastic terminal (9123) may be PEEK or fluorinated rubber, which can be formed in any shapes adaptive for buffering the contact with the bottom lid. FIG. 11 illustrates one further embodiment of the pillar. Referring together with FIG. 12, a pillar (1012) has an elastic frame (1100) and a terminal (1101) connecting to a bottom of the elastic frame (1100). The elastic frame (1100) is composed of plural connected frames that are vertically compressible and each of the frames extends in two-dimension. The elastic frames (1100) has plural hollows that provides a buffer to the pillar (1100) during its vertical compression. The terminal (1101) may be selected from hard or soft materials and formed in any shapes adaptive for engaging with the bottom lid.

Figure 13:
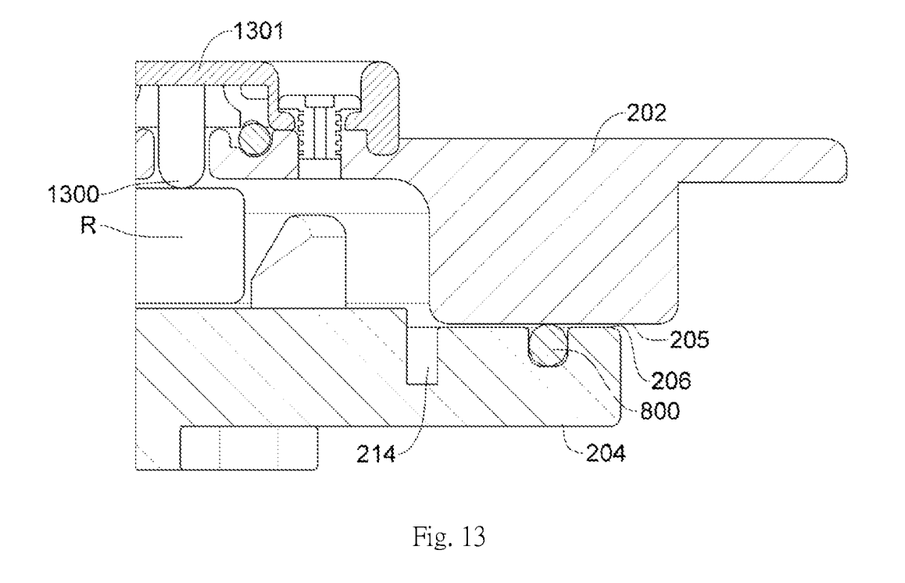
FIG. 13 illustrates another configuration according to FIG. 8.

FIG. 13 is another configuration of FIG. 8, in which at least one holding pin (1300) is provided at the ceiling (201) of the top lid and extending downward. The holding pin (1300) is a member not movable relatively to the top lid. As shown in the cross-sectional view, the holding pin (1300) is generally formed in a T-shape and its top is secured by a cap (1301). In the case where the top lid and the bottom lid engage with each other, a terminal of the holding pin (1300) contact with the top surface of the reticle (R), and whereby the holding pin (1300) can slightly lift the top lid with a height, but the height of the holding pin (1300) is selected so that the cover (202) does not separate from the soft contact member (800), and therefore the hermetical sealing to the reticle accommodation space can be maintained.

Above all, the reticle storage device according to the invention offers a design that provides soft contact members between the top lid and the bottom lid, giving the device or the inner pod the hermetical sealing, and enhancing the anti-particle effect for device.

The above-mentioned details provide a thorough description regarding the manufacture and use of combinations of said embodiments. Various embodiments can be made without departing from the spirit and scope of such description. Thus, these embodiments will be included in the appended claims.

What is claimed is:

1. A reticle storage device, comprising:
a top lid, having a ceiling and a cover surrounding the ceiling;
a bottom lid, having a carrier and a peripheral structure surrounding the carrier, wherein the peripheral structure faces the cover when the top lid and the bottom lid engages with each other; and
a soft contact member, configured to extend between the cover and the peripheral structure where the top lid and the bottom lid engage with each other in order to buffer the contact of the top lid and the bottom lid,
wherein the cover of the top lid has a downward engaging surface, and the soft contact member extends along and wraps the downward engaging surface, such that a hermetical seal is formed by the soft contact member when the top lid and the bottom lid engages with each other;
wherein the cover of the top lid has a plurality of pillars down extending from the downward engaging surface, the peripheral structure has a plurality of accommodation cavities corresponding to the plurality of pillars, each of the plurality of pillars has at least one elastic structure configured for buffering the contact of the top lid and the bottom lid.

2. The reticle storage device as claimed in claim 1, wherein the soft contact member extends from an inside to an outside of the device.

3. The reticle storage device as claimed in claim 2, wherein the soft contact member has at least one rib down extending therefrom, the at least rib is configured for contacting with an upward engaging surface of the peripheral structure of the bottom lid to form the hermetical seal between.

4. The reticle storage device as claimed in claim 1, wherein the peripheral structure and the carrier of the bottom lid define at least one trench therebetween.

5. The reticle storage device as claimed in claim 1, wherein the top lid and the bottom lid define a reticle accommodation space which is hermetically sealed by the soft contact member.

6. The reticle storage device as claimed in claim 5, wherein the top lid further has at least one holding pin extending therefrom for contacting with a reticle received in the reticle accommodation space without breaking the hermetical sealing of the reticle accommodation space.

7. A reticle storage device, comprising:
a top lid, having a ceiling and a cover surrounding the ceiling;
a bottom lid, having a carrier and a peripheral structure surrounding the carrier, wherein the peripheral structure has an upward engaging surface lower than the carrier and faces the cover when the top lid and the bottom lid engages with each other;
a first soft contact member, extending laterally along a downward engaging surface of the cover of the top lid; and
a second soft contact member, extending laterally along the upward engaging surface of the peripheral structure of the bottom lid,
wherein the first soft contact member corresponding to the downward engaging surface and the second soft contact member corresponding to the upward engaging surface contact with each other when the top lid engages with the bottom lid so as to buffer the contact among the top lid and the bottom lid and form a hermetical seal.

8. The reticle storage device as claimed in claim 7, wherein an inside of the first soft contact member contacts with an outside of the second soft contact member.

9. The reticle storage device as claimed in claim 7, wherein at least a part of the first soft contact member wraps the cover of the top lid.

10. The reticle storage device as claimed in claim 7, wherein the hardness of the first contact member is larger than that of the second soft contact member.

11. The reticle storage device as claimed in claim 7, wherein the cover of the top lid has a downward engaging surface and a plurality of pillars down extending from the downward engaging surface, the peripheral structure has a plurality of accommodation cavities corresponding to the plurality of pillars, each of the plurality of pillars has at least one elastic structure configured for buffering the contact of the top lid and the bottom lid.

12. The reticle storage device as claimed in claim 7, wherein the peripheral structure and the carrier of the bottom lid define at least one trench therebetween.

13. The reticle storage device as claimed in claim 7, wherein the top lid and the bottom lid define a reticle accommodation space which is hermetically sealed by the first and the second soft contact members.

14. The reticle storage device as claimed in claim 13, wherein the top lid further has at least one holding pin extending therefrom for contacting with a reticle received in the reticle accommodation space without breaking the hermetical sealing of the reticle accommodation space.

15. A reticle storage device, comprising:
a top lid, having a ceiling and a cover surrounding the ceiling;

a bottom lid, having a carrier and a peripheral structure surrounding the carrier; and at least one holding pin, extending down from the top lid and secured by a cap, wherein the cover faces the peripheral structure when the top lid and the bottom lid engage with each other, wherein the cover of the top lid has a downward engaging surface and a plurality of pillars down extending from the downward engaging surface, the peripheral structure has a plurality of accommodation cavities corresponding to the plurality of pillars, each of the plurality of pillars has at least one elastic structure.

16. The reticle storage device as claimed in claim 15, further comprising: at least one soft contact member configured to extend between the cover and the peripheral structure when the top lid and the bottom lid engage with each other.

* * * * *